(12) United States Patent
Hibino

(10) Patent No.: US 8,994,250 B2
(45) Date of Patent: Mar. 31, 2015

(54) PIEZOELECTRIC/ELECTROSTRICTIVE ELEMENT

(75) Inventor: Tomohiko Hibino, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 458 days.

(21) Appl. No.: 13/473,975

(22) Filed: May 17, 2012

(65) Prior Publication Data

US 2012/0306324 A1 Dec. 6, 2012

(30) Foreign Application Priority Data

Jun. 3, 2011 (JP) ................................. 2011-125699

(51) Int. Cl.
| | |
|---|---|
| H01L 41/18 | (2006.01) |
| C04B 35/00 | (2006.01) |
| B32B 18/00 | (2006.01) |
| C04B 35/493 | (2006.01) |
| H01L 41/083 | (2006.01) |
| H01L 41/187 | (2006.01) |

(52) U.S. Cl.
CPC ............ *H01L 41/1876* (2013.01); *B32B 18/00* (2013.01); *C04B 35/493* (2013.01); *C04B 2235/3212* (2013.01); *C04B 2235/3217* (2013.01); *C04B 2235/3251* (2013.01); *C04B 2235/3279* (2013.01); *C04B 2235/5436* (2013.01); *C04B 2235/5445* (2013.01); *C04B 2235/6025* (2013.01); *C04B 2235/768* (2013.01); *C04B 2235/785* (2013.01); *C04B 2235/786* (2013.01); *C04B 2237/348* (2013.01); *H01L 41/083* (2013.01)
USPC ............................ 310/358; 501/134; 252/62.9

(58) Field of Classification Search
USPC .......................... 310/358; 252/62.9; 501/134
See application file for complete search history.

(56) References Cited

U.S. PATENT DOCUMENTS

| | | | |
|---|---|---|---|
| 6,299,791 B1 * | 10/2001 | Yoshizawa et al. | .... 252/62.9 PZ |
| 7,545,084 B2 * | 6/2009 | Nanataki et al. | ............ 310/358 |
| 2009/0267446 A1 | 10/2009 | Kashiwaya et al. | |

FOREIGN PATENT DOCUMENTS

| | | |
|---|---|---|
| JP | 2001-302349 A1 | 10/2001 |
| JP | 2004-115346 A1 | 4/2004 |
| JP | 2007-329414 A1 | 12/2007 |
| JP | 2009-091215 A1 | 4/2009 |

OTHER PUBLICATIONS

Extended European Search Report (Application No. 12169747.8) dated Jan. 2, 2014.

(Continued)

*Primary Examiner* — Thomas Dougherty
(74) *Attorney, Agent, or Firm* — Burr & Brown, PLLC

(57) ABSTRACT

There is provided a piezoelectric/electrostrictive element 1 comprising a piezoelectric/electrostrictive body 30 made of a piezoelectric/electrostrictive ceramic composition containing $Pb(Ni_{1/3}Nb_{2/3})O_3$—$PbTiO_3$—$PbZrO_3$ ternary solid solution system composition as the main components, and an electrode disposed on the piezoelectric/electrostrictive body, wherein the ternary solid solution system composition is represented by the following composition formula:

$$(Pb_{1-x}Sr_x)_\alpha\{(Ti_{1-y}Zr_y)_a(Ni_{\beta/3}Nb_{2/3})_b(Al_{\gamma/2}Nb_{1/2})_c\}O_3$$

(where $0.005 \le x \le 0.03$, $0.45 \le y \le 0.54$, $0.58 \le a \le 0.91$, $0.07 \le b \le 0.36$, $0.02 \le c \le 0.08$, $0.97 \le \alpha \le 1.03$, $0.97 \le \beta \le 1.03$, $0.97 \le \gamma \le 1.03$, and $(a+b+c=1.000)$).

4 Claims, 4 Drawing Sheets

(56) References Cited

OTHER PUBLICATIONS

Japanese Office Action (Application No. 2011-125699) dated Jul. 22, 2014.

European Office Action, European Application No. 12 169 747.8, dated Jan. 9, 2015 (3 pages).

* cited by examiner

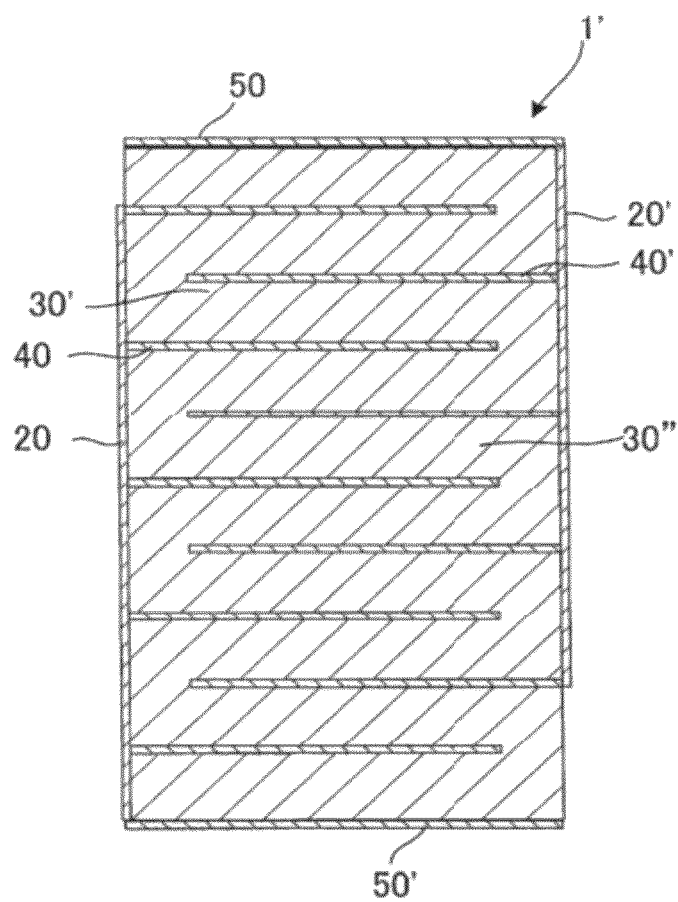

PIEZOELECTRIC/ELECTROSTRICTIVE ELEMENT

FIELD OF THE INVENTION

The present invention relates to a piezoelectric/electrostrictive element. More specifically, the present invention relates to a piezoelectric/electrostrictive element using a piezoelectric/electrostrictive body made of a PNN-PZT type piezoelectric/electrostrictive ceramic composition.

BACKGROUND OF THE INVENTION

In recent years, there has been used a small piezoelectric/electrostrictive element for a power source of a HD (hard disk) head, a motor of a cell phone or a digital camera, a power source for ejecting ink of an ink-jet printer, or the like.

In a film type piezoelectric/electrostrictive actuator, it is effective to make the thickness of the film thin in order to obtain a large displacement in the case of using the actuator in the Same driving electric field, and the thickness can be reduced to about 10 μm or less. A piezoelectric/electrostrictive ceramic composition used for such a film type piezoelectric/electrostrictive actuator is required to have a characteristic that the increase rate of the displacement is not decreased even when the electric field becomes higher.

In contrast, there is a laminate type piezoelectric/electrostrictive actuator having a thickness of about 100 μm, and the driving electric field is lower than that of a film type piezoelectric/electrostrictive actuator. Such a laminate type piezoelectric/electrostrictive actuator is required to have a characteristic of having a large displacement upon applying a low electric field while it is not requested to have the characteristic of having a large displacement upon applying a high electric field.

As a piezoelectric/electrostrictive ceramic compositions used for such a laminate type piezoelectric/electrostrictive element, there have conventionally been known compositions having composition formulae of $Pb(Mg_{1/3}Nb_{2/3})O_3$—$PbTiO_3$—$PbZrO_3$ (sometimes referred to as PMN-PZT type), $Pb(Ni_{1/3}Nb_{2/3})O_3$—$PbTiO_3$—$PbZrO_3$ (sometimes referred to as PNN-PZT type), and $Pb(Zn_{1/3}Nb_{2/3})O_3$—$PbTiO_3$—$PbZrO_3$ (sometimes referred to as PZN-PZT type) (see, e.g., JP-A-2001-302349 and JP-A-2004-115346).

A piezoelectric/electrostrictive actuator using a conventional piezoelectric/electrostrictive ceramic composition satisfies a required displacement and shows high insulation resistance value at an early stage of manufacture. However, in the case of using the piezoelectric/electrostrictive actuator repetitively, the insulation resistance value of the piezoelectric/electrostrictive actuator may decline over time. In particular, in the case of using the piezoelectric/electrostrictive actuator under a high-humidity environment, the insulation resistance value may decline to a great extent. Such a decline in the insulation resistance value under a high-humidity environment is a problem to be solved from the viewpoint of high reliability in recent years.

SUMMARY OF THE INVENTION

The present invention has been made in view of aforementioned problems of the related art. And, the object thereof is to provide a piezoelectric/electrostrictive element capable of maintaining a desired displacement comparable with a conventional element, with less of a decline in the insulation resistance value even when it is used under a high-humidity environment.

The present inventors have intensively carried out investigations to achieve the above objects, and have eventually found out that the aforementioned object can be solved by the use of a PNN-PZT type piezoelectric/electrostrictive ceramic composition where a small part of the Pb ion is substituted with a Sr ion and where a part of a composition represented by $(Ni_{\beta/3}Nb_{2/3})$ is substituted with a composition represented by $(Al_{\gamma/2}Nb_{1/2})$, thereby completing the present invention.

That is, according to the present invention, there is provided the piezoelectric/electrostrictive element as follows.

[1] A piezoelectric/electrostrictive element comprising a piezoelectric/electrostrictive body made of a piezoelectric/electrostrictive ceramic composition containing $Pb(Ni_{1/3}Nb_{2/3})O_3$—$PbTiO_3$—$PbZrO_3$ ternary solid solution system composition as a main component, and an electrode disposed on the piezoelectric/electrostrictive body, wherein the ternary solid solution system composition is represented by the following composition formula:

$$(Pb_{1-x}Sr_x)_\alpha\{(Ti_{1-y}Zr_y)_a(Ni_{\beta/3}Nb_{2/3})_b(Al_{\gamma/2}Nb_{1/2})_c\}O_3$$

(where $0.005 \le x \le 0.03$, $0.45 \le y \le 0.54$, $0.58 \le a \le 0.91$, $0.07 \le b \le 0.36$, $0.02 \le c \le 0.08$, $0.97 \le \alpha \le 1.03$, $0.97 \le \beta \le 1.03$, $0.97 \le \gamma \le 1.03$, and (a+b+c=1.000)).

[2] A piezoelectric/electrostrictive element according to [1], which comprises a plurality of piezoelectric/electrostrictive bodies and a plurality of electrodes, wherein the plurality of piezoelectric/electrostrictive bodies are alternately laminated with the plurality of electrodes to have a laminate structure.

[3] A piezoelectric/electrostrictive element according to [1] or [2], wherein an average grain diameter of grains constituting the piezoelectric/electrostrictive body is 0.5 to 2 μm.

A piezoelectric/electrostrictive element of the present invention has such an effect that a desired displacement comparable with a conventional element can be maintained, with less of a decline in the insulation resistance value even when it is used under a high-humidity environment.

BRIEF DESCRIPTION OF THE DRAWINGS

FIG. 3 is a schematic view showing a cross section of another embodiment of a piezoelectric/electrostrictive element of the present invention.

Figure 1:
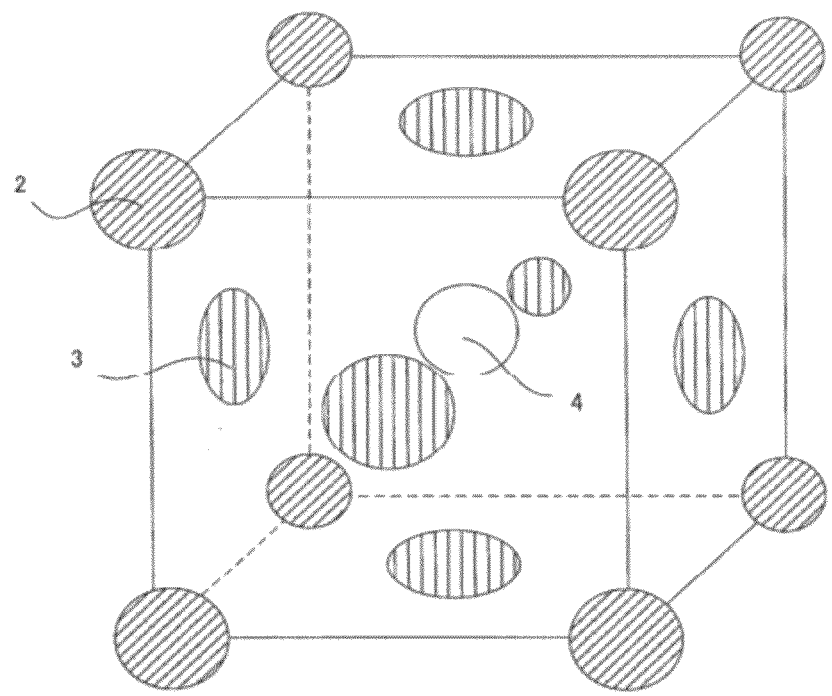
FIG. 1 is a schematic view showing a crystal structure of a perovskite-type structure.

REFERENCE NUMERALS 1, 1': piezoelectric/electrostrictive element, 2: A site ion, 3: oxygen ion, 4: B site ion, 10, 10': electrode, 20, 20': side electrode, 30, 30', 30": piezoelectric/electrostrictive body, 40, 40': internal electrode, 50: upper electrode, 50': lower electrode

DETAILED DESCRIPTION OF THE INVENTION

Hereinbelow, embodiments of the present invention will be described. However, the present invention is not limited to the following embodiments. It should be understood that embodiments where changes, improvements, and the like are suitably added to the following embodiments on the basis of ordinary knowledge of a person of ordinary skill in the range without departing from the scope of the present invention are also included in the scope of the present invention.

1. Definition:

The "main component" in the phrase of "containing $Pb(Ni_{1/3}Nb_{2/3})O_3$—$PbTiO_3$—$PbZrO_3$ ternary solid solution system composition as a main component" means that the ratio of the PNN-PZT type composition to the entire piezoelectric/electrostrictive ceramic composition is 95 mass % or more, preferably 98 mass % or more.

The perovskite-type structure ideally means a cubic crystal structure which is represented by $ABO_3$. Actually, however, it may take on a tetragonal structure, orthorhombic structure, rhombohedral structure, and monoclinic structure. More specifically, as shown in FIG. 1, A (hereinbelow sometimes referred to as the "A site ion") 2 is located at the position of each of the vertexes of the crystal structure, B (hereinbelow sometimes referred to as the "B site ion") 4 is located at the position of body center of the crystal structure, and O ion (oxygen ion) 3 is located at the position of face center of the crystal structure.

In the present specification, the "grains" mean grains constituting the piezoelectric/electrostrictive body. In addition, the "piezoelectric powder particles" mean powdery particles before constituting the piezoelectric/electrostrictive body. That is, the "particles" include powdery particles after calcination or powdery particles obtained by pulverizing the powdery particles after calcination.

As shown in FIG. 3, the laminate structure means a structure provided with a plurality of piezoelectric/electrostrictive bodies (30', 30") and a plurality of internal electrodes (40, 40'), and laminated in such a state that the plural piezoelectric/electrostrictive bodies (30', 30") are alternately sandwiched by the plural internal electrodes (40, 40'). Incidentally, though it is not depicted, a number of the plurality of the piezoelectric/electrostrictive bodies (30', 30") may alternately be sandwiched by a number of the plurality of the internal electrodes (40, 40') to have the laminate structure.

2. Piezoelectric/electrostrictive element:

A piezoelectric/electrostrictive element of the present invention is provided with a piezoelectric/electrostrictive body made of a piezoelectric/electrostrictive ceramic composition containing $Pb(Ni_{1/3}Nb_{2/3})O_3$—$PbTiO_3$—$PbZrO_3$ ternary solid solution system composition as a main component, and an electrode disposed on the piezoelectric/electrostrictive body. A detailed description will be given below.

2-1. Piezoelectric/electrostrictive Ceramic Composition:

The piezoelectric/electrostrictive ceramic composition contains $Pb(Ni_{1/3}Nb_{2/3})O_3$—$PbTiO_3$—$PbZrO_3$ ternary solid solution system composition as a main component, and the ternary solid solution system composition is represented by the following composition formula:

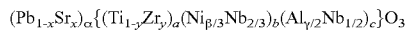

(where $0.005 \le x \le 0.03$, $0.45 \le y \le 0.54$, $0.58 \le a \le 0.91$, $0.07 \le b \le 0.36$, $0.02 \le c \le 0.08$, $0.97 \le \alpha \le 1.03$, $0.97 \le \beta \le 1.03$, $0.97 \le \gamma \le 1.03$, and (a+b+c=1.000)).

The PNN-PZT type composition represented by the aforementioned composition formula has a perovskite-type structure. That is, $(Pb_{1-x}Sr_x)$ is located as the A site ion, and $\{(Ti_{1-y}Zr_y)_a(Ni_{\beta/3}Nb_{2/3})_b(Al_{\gamma/2}Nb_{1/2})_c\}$ is located as the B site ion. A small part of the Pb ion constituting the A site ion is substituted with a Sr ion, and a part of $(Ni_{\beta/3}Nb_{2/3})$ constituting the B site ion is substituted with $(Al_{\gamma/2}Nb_{1/2})$.

That is, the piezoelectric/electrostrictive ceramic composition is a composition where a part of the B site ion is substituted with the Al ion. Among the elements constituting the B site ion, Al has the smallest ionic radius. Therefore, the stability of the crystal structure is increased by substituting a small part of the Pb ion with Sr ion having a smaller ionic radius than Pb ion at the A site ion. By such a substituting at the A site ion and the B site ion, one may manufacture a piezoelectric/electrostrictive ceramic composition capable of maintaining a desired displacement comparable with a conventional element, with less of a decline in the insulation resistance value even when it is used under a high-humidity environment.

In the aforementioned composition, the value of $\alpha$ is not limited to 1.00. Therefore, the PNN-PZT type composition includes not only stoichiometric compositions where the ratio of the A site ion to the B site ion is specified to 1:1, but also nonstoichiometric compositions.

In the aforementioned composition, the $\alpha$ range showing the ratio of the A site ion to the B site ion is $0.97 \le \alpha \le 1.03$. Since the value of $\alpha$ is within this range, there can be manufactured a piezoelectric/electrostrictive element capable of maintaining a displacement comparable with a conventional element, with less of a decline in the insulation resistance value even when it is used under a high-humidity environment.

In addition, the range of x showing the ratio of the Sr ion substituting the Pb ion is $0.005 \le x \le 0.03$, preferably $0 \le x \le 02$. Since x is within this range, the value of the average grain diameter of the grains constituting the piezoelectric/electrostrictive body made of a piezoelectric/electrostrictive ceramic composition can be designed to be small, and there can be manufactured a piezoelectric/electrostrictive element having less of a decline in the insulation resistance value even if it is used under a high-humidity environment.

Further, the range of y showing the ratio of the Ti ion to the Zr ion is $0.45 \le y \le 0.54$, preferably $0.47 \le y \le 0.52$, more preferably $0.48 \le y \le 0.50$. Since y is within this range, there can be manufactured a piezoelectric/electrostrictive element capable of maintaining a desired displacement comparable with a conventional element.

In addition, the range of a showing the ratio of the composition represented by $(Ti_{1-y}Zr_y)$ in the B site ion is $0.58 \le a \le 0.91$, preferably $0.58 \le a \le 0.86$. Further, the range of b showing the ratio of the composition represented by $(Ni_{\beta/3}Nb_{2/3})$ in the B site ion is $0.07 \le b \le 0.36$, preferably $0.07 \le b \le 0.20$. Since b is within this range, the decline in the insulation resistance value can be suppressed even if the piezoelectric/electrostrictive element is used under a high-humidity environment. When b is below 0.07, the insulation resistance value may be reduced in the case that the piezoelectric/electrostrictive element is used under a high-humidity environment.

Further, the range of c showing the ratio of the composition represented by $(Al_{\gamma/2}Nb_{1/2})$ in the B site ion is $0.02 \le c \le 0.08$. When c is within this range, the value of the average grain diameter of the grains constituting the piezoelectric/electrostrictive body made of a piezoelectric/electrostrictive ceramic composition can be designed to be small, and the decline in the insulation resistance value may be suppressed even if the piezoelectric/electrostrictive element is used under a high-humidity environment. When c is below 0.02, the insulation resistance value may be reduced in the case that the piezoelectric/electrostrictive element is used under a high-humidity environment. On the other hand, when c is above 0.08, the displacement of the piezoelectric/electrostrictive element may be reduced.

The range of β showing the ratio of the Ni ion to the Nb ion and the range of γ showing the ratio of Al to Nb are $0.97 \leq \beta \leq 1.03$ and $0.97 \leq \gamma \leq 1.03$, respectively.

Each parameter in the aforementioned composition formula is the value calculated as follows. In the first place, the piezoelectric/electrostrictive ceramic composition is analyzed with a fluorescent X-ray spectrometer, and a weight ratio of each element is measured. After the result is converted into oxide, it is converted into a composition formula to calculate the value.

Method for Preparing Piezoelectric/Electrostrictive Ceramic Composition

Next, a method for preparing a piezoelectric/electrostrictive ceramic composition will be described. Upon preparing a piezoelectric/electrostrictive ceramic composition, in the first place, various raw material compounds are mixed together to obtain a mixed raw material so as to have the aforementioned composition formula:

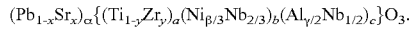

$$(Pb_{1-x}Sr_x)_\alpha\{(Ti_{1-y}Zr_y)_a(Ni_{\beta/3}Nb_{2/3})_b(Al_{\gamma/2}Nb_{1/2})_c\}O_3.$$

Specific examples of the raw material compounds include each simple element of Pb, Ni, Nb, Zr, Ti, Al, or Sr, oxides (PbO, $Pb_3O_4$, NiO, $Nb_2O_5$, $TiO_2$, $ZrO_2$, $Al_2O_3$, SrO, etc.), carbonates ($SrCO_3$, etc.) of these elements, or compounds containing a plurality of these elements ($NiNb_2O_6$, etc.).

As the method for mixing the raw material compounds, a general method may be utilized. For example, a ball mill can be utilized. Specifically, predetermined amounts of various raw material compounds, balls, and water are put into a ball mill, and they are rotated for a predetermined time to prepare mixed slurry. Next, the prepared mixed slurry is dried with a drier or by an operation of filtration or the like to obtain a mixed raw material.

After the mixed raw material is calcined at 750 to 1100° C., it is fired at 950° C. or more and below 1300° C. to obtain a piezoelectric/electrostrictive ceramic composition.

The obtained piezoelectric/electrostrictive ceramic composition may be pulverized as necessary. The pulverization can be performed by a method such as ball milling. The average particle diameter of the piezoelectric powder particles obtained by pulverizing the piezoelectric/electrostrictive ceramic composition is preferably 0.1 to 1.0 µm, more preferably 0.2 to 0.7 µm. Incidentally, the adjustment of the average particle diameter of the piezoelectric powder particles may be performed by subjecting the powder of the piezoelectric/electrostrictive ceramic composition obtained by the pulverization to a thermal treatment at 400 to 750° C. At this time, it is preferable to use powders having finer particle diameters for the production of a piezoelectric/electrostrictive body having a uniform average grain diameters since the piezoelectric powdery grains become powders having uniform particle diameters as a result of integration with other powdery particles. The piezoelectric/electrostrictive ceramic composition may be prepared by, for example, the alkoxide method or the coprecipitation method.

Incidentally, Al component is hardly present as a solid solution in the piezoelectric/electrostrictive body, and may remain as a different phase component. Therefore, upon preparing the piezoelectric/electrostrictive ceramic composition, it is preferable to use the one obtained preliminarily by mixing $Nb_2O_5$ and $Al_2O_3$, calcining, and pulverized.

2-2. Piezoelectric/Electrostrictive Body:

The piezoelectric/electrostrictive body is made of the aforementioned piezoelectric/electrostrictive ceramic composition. The average grain diameter of the grains constituting the piezoelectric/electrostrictive body is preferably 0.5 to 2 µm, more preferably 1 to 1.7 µm. When the average grain diameter of the grains is within this range, there can be manufactured a piezoelectric/electrostrictive element capable of maintaining a displacement comparable with a conventional element, and suppressing the decline in the insulation resistance value even if it is used under a high-humidity environment. When the average grain diameter of the grains constituting the piezoelectric/electrostrictive body is below 0.5 µm, the displacement of the piezoelectric/electrostrictive element may be reduced. On the other hand, when it is above 2 µm, the insulation resistance value of the piezoelectric/electrostrictive element may be declined in the case that it is used under a high-humidity environment.

Generally, the smaller the average grain diameter of grains, the more superior in strength the ceramic. However, when the average grain diameter of the grains is small, the piezoelectric/electrostrictive body tends to have reduced displacement as a so-called "size effect". However, the piezoelectric/electrostrictive body made of the aforementioned piezoelectric/electrostrictive ceramic composition can show a displacement comparable with a conventional composition even if an average grain diameter of the grains is 0.5 to 2 µm, which is small.

That is, the piezoelectric/electrostrictive body made of the aforementioned piezoelectric/electrostrictive ceramic composition is capable of maintaining a desired displacement, and expanding the capability of improving the strength. In the aforementioned piezoelectric/electrostrictive ceramic composition, the average grain diameter of the grains constituting the piezoelectric/electrostrictive body can be designed to be small by substituting a part of the B site ion with $(Al_{\gamma/2}Nb_{1/2})$. Since the average grain diameter of the grains is small, it is difficult for water to enter the fine gaps generated in a grain boundary, and therefore, it is possible to manufacture a piezoelectric/electrostrictive element showing less of a decline in the insulation resistance value even if it is used under a high-humidity environment.

In addition, the average grain diameter of the grains constituting the piezoelectric/electrostrictive body can also be designed to be small by substituting a part of the A site ion with Sr. Further, the average grain diameter of the grains constituting the piezoelectric/electrostrictive body can easily be designed to be small by substituting a part of the A site ion with Sr and substituting a part of the B site ion with $(Al_{\gamma/2}Nb_{1/2})$.

The average grain diameter of the grains means a value calculated as follows. In the first place, a piezoelectric/electrostrictive body is observed at about 8000-fold magnification with a scanning electron microscope so that the grain diameter of the grains can be observed at about 5 to 10 mm. Then, the grain diameters of 100 or more grains in the electron micrograph of the observed piezoelectric/electrostrictive body are measured. And the average of the grain diameters is employed as the average grain diameter of the grains.

The thickness of the piezoelectric/electrostrictive body is preferably 1 to 200 µm, more preferably 3 to 100 µm. When the thickness of the piezoelectric/electrostrictive body is below 1 µm, densification may become insufficient even in a piezoelectric/electrostrictive body made of the aforementioned piezoelectric/electrostrictive ceramic composition. Incidentally, in the case that the piezoelectric/electrostrictive element has a laminate structure, the same can be applied to the thickness of each of the plural piezoelectric/electrostrictive bodies.

In the case that the piezoelectric/electrostrictive element has a laminate structure, the total thickness of the piezoelectric/electrostrictive bodies is preferably 20 μm to 5 mm, more preferably 40 μm to 1 mm. In the case that the total thickness of the piezoelectric/electrostrictive bodies is below 20 μm, it may become difficult to handle since the strength is low. On the other hand, in the case that it is above 5 mm, it may become difficult to perform the degreasing or firing.

Method for Preparing Piezoelectric/Electrostrictive Body

A method for preparing a piezoelectric/electrostrictive body will be described. A piezoelectric/electrostrictive body can be prepared by calcining the piezoelectric/electrostrictive ceramic composition, pulverizing, and then firing. The calcination temperature is generally 750 to 1100° C., and the firing temperature is generally 950° C. or more and below 1300° C.

Figure 2:
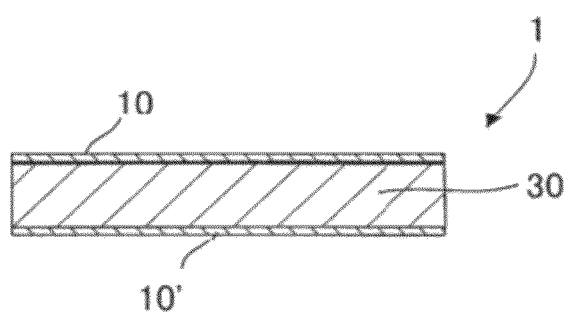
FIG. 2 is a schematic view showing a cross section of an embodiment of a piezoelectric/electrostrictive element of the present invention.

2-3. Piezoelectric/Electrostrictive Element:

As shown in FIG. 2, the piezoelectric/electrostrictive element 1 is provided with the aforementioned piezoelectric/electrostrictive body 30 and electrodes (10, 10') disposed on the piezoelectric/electrostrictive body 30. Since the piezoelectric/electrostrictive body is made of the piezoelectric/electrostrictive ceramic composition having a predetermined composition formula, it can suppress the decline in the insulation resistance value even if it is used under a high-humidity environment.

In addition, as shown in FIG. 3, it is preferable that the piezoelectric/electrostrictive element 1' is provided with a plurality of piezoelectric/electrostrictive bodies (30', 30") and a plurality of internal electrodes (40, 40'), and has a laminate structure. In the case that the piezoelectric/electrostrictive element has a laminate structure, a large displacement can be obtained even if a small electric field is applied.

2-4. Electrode:

The electrodes are disposed on the piezoelectric/electrostrictive body. In the embodiment of FIG. 3, for convenience sake, a plurality of electrodes (40, 40') alternately sandwiching a plurality of piezoelectric/electrostrictive bodies (30', 30") are referred to as internal electrodes. Moreover, the electrodes disposed on the surfaces of the piezoelectric/electrostrictive element 1', and in the upper portion and the lower portion thereof are referred to as the upper electrode 50 and the lower electrode 50', respectively. Furthermore, the electrodes disposed on the surfaces of the piezoelectric/electrostrictive element 1', and on the side faces thereof are referred to as the side electrodes (20, 20'). Incidentally, as in the embodiment of FIG. 2, in the case that the piezoelectric/electrostrictive body 30 is a one, a pair of electrodes (10, 10') is disposed on the surfaces of the upper portion and the lower portion of the piezoelectric/electrostrictive body 30.

The material for the electrodes is at least one kind of metal selected from the group consisting of Pt, Pd, Rh, Au, Ag, Cu, Ni and alloys of these metals. Of these, platinum, or an alloy containing platinum as the main component is preferable from a viewpoint of high thermal resistance upon firing the piezoelectric/electrostrictive body. In addition, from a viewpoint of cost, alloys such as Ag—Pd, Cu, or Ni can suitably be used as the material for the electrodes.

As shown in FIG. 3, in the case that the piezoelectric/electrostrictive element 1' of the present invention has a columnar laminate structure, it is preferable to further provide side electrodes (20, 20') disposed on the side face and electrically connecting the internal electrodes (40, 40') to the upper electrode 50 and the lower electrode 50'. This enables the application of alternately different voltages to the internal electrodes (40, 40') when a voltage is applied to the upper electrode 50 and the lower electrode 50' easily to apply a desired electric field to the internal electrodes (40, 40').

Internal Electrode

The internal electrodes are electrically connected to the piezoelectric/electrostrictive bodies and preferably disposed between each of piezoelectric/electrostrictive bodies. In addition, the internal electrodes are preferably disposed in a state of containing a region substantially contributing to the displacement or the like of the piezoelectric/electrostrictive bodies. Specifically, as shown in FIG. 3, it is preferable that the internal electrodes (40, 40') are disposed in the region of 80% by area including around the central portion of each of the plural piezoelectric/electrostrictive bodies (30', 30").

The thickness of the internal electrodes is preferably 5 μm or less, more preferably 2 μm or less. When it is above 5 μm, the internal electrodes may serve as buffer layers to decrease the displacement. Incidentally, the thickness of the internal electrodes should be 0.05 μm or more from the viewpoint of exhibiting a substantial function as internal electrodes.

The method for forming the internal electrodes may be, for example, ion beam, sputtering, vacuum deposition, PVD, ion plating, CVD, coating, screen printing, spraying, or dipping. Of these, from a viewpoint of connecting with the piezoelectric/electrostrictive body, sputtering or screen printing is preferable. The internal electrodes thus formed can become unified with the piezoelectric/electrostrictive body by firing (thermal treatment) at about 600 to 1400° C. The firing may be performed with respect to each forming an internal electrode or may be performed together with the thermal treatment for an unfired piezoelectric/electrostrictive body in a lump.

3. Method for manufacturing a piezoelectric/electrostrictive element:

After calcining the mixed powder obtained by the method described in the above method for preparing a piezoelectric/electrostrictive ceramic composition, pulverization is performed to prepare a powder of the piezoelectric/electrostrictive ceramic composition. With this powder, a piezoelectric/electrostrictive tape having a desired thickness is formed by a doctor blade method, and an internal electrode having a desired thickness after firing is formed on one surface of the piezoelectric/electrostrictive tape. The predetermined layer numbers of the piezoelectric/electrostrictive tapes and the internal electrodes are alternately laminated, and a layer of the piezoelectric/electrostrictive tape where the internal electrode is not formed is further laminated on the internal electrode side which is exposed on the surface thereof to prepare a laminated body. After the laminated body is fired, it is cut at a predetermined position to have a predetermined size. Finally, a pair of electrodes and side electrodes are formed on the external portion of the laminated body to manufacture a piezoelectric/electrostrictive element.

EXAMPLE

The present invention will be described specifically on the basis of Examples. However, the present invention is not limited by these Examples. Incidentally, "part(s)" and "%" in Examples and Comparative Examples are based on mass unless otherwise noted. The measurement methods of various property values and the evaluation methods of the properties are shown below.

[High humidity insulation (Ω)]: The sine waves (frequency of 1 kHz) with an electric field of 0-2.4 kV/mm electric field was applied for 500 hours under an environment having a humidity of 85% and a temperature of 85° C. After that, the insulation resistance value was measured. In the case that the insulation resistance value was below $1.0 \times 10^8 \Omega$, it was evaluated as "poor". In the case that the insulation resistance value was $1.0 \times 10^8 \Omega$ to $9.5 \times 10^9 \Omega$, it was evaluated as "good". In the case that the insulation resistance value was above $9.5 \times 10^9 \Omega$, it was evaluated as "excellent".

[Displacement (nm)]: The displacement upon applying an electric field of 2.4 kV/mm was measured by a laser doppler (trade name of "NLV-2500" produced by Polytec Inc.). In the case that the displacement was below 200 nm, it was evaluated as "poor". In the case that the displacement was 200 to 230 nm, it was evaluated as "good". In the case that the displacement was above 230 nm, it was evaluated as "excellent".

[Average grain diameter (μm)]: The piezoelectric/electrostrictive bodies were observed at 8000-fold magnification by using a scanning type electron microscope (JSM-7000F produced by JEOL Ltd.). The grain diameters of 100 grains in the electron micrograph were measured, and the average was calculated.

Example 1

Each of the raw materials of PbO, TiO$_2$, ZrO$_2$, NiO, Nb$_2$O$_5$, Al$_2$O$_3$, NiO, and SrCO$_3$ was weighed so as to have a composition formula of $(Pb_{0.980}Sr_{0.020})_{1.000}\{(Ti_{0.512}Zr_{0.488})_{0.850}\ (Ni_{1/3}Nb_{2/3})_{0.070}(Al_{1/2}Nb_{1/2})_{0.080}\}O_3$. These are mixed in a ball mill for 24 hours together with a predetermined amount of water to obtain prepared slurry. The obtained prepared slurry was put in a hot air drier to evaporate water and dried to obtain a raw material powder.

Figure 4A:
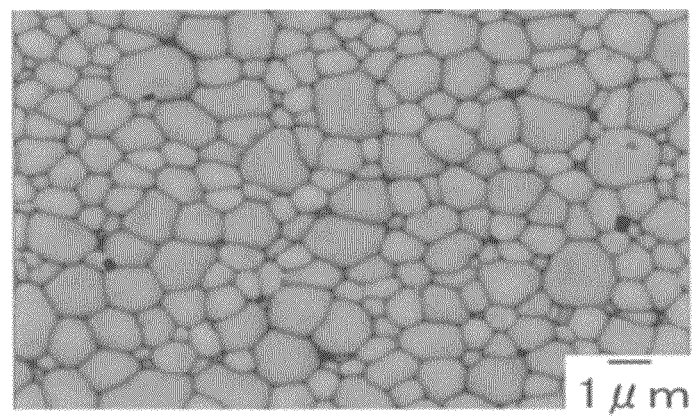
FIG. 4A is an electron micrograph showing a piezoelectric/electrostrictive body constituting the piezoelectric/electrostrictive element of Example 1.

After the mixed powder obtained above was calcined, it was pulverized to prepare a powder of a piezoelectric/electrostrictive ceramic composition. With the powder, a piezoelectric/electrostrictive tape having a thickness of 12 μm was formed by a doctor blade method. A Pt electrode was formed on one face of the piezoelectric/electrostrictive tape in such a manner that the electrode might have a thickness of 1 μm after firing. After three layers of this structure were laminated to obtain a laminated body, a layer of the piezoelectric/electrostrictive tape having no internal electrode formed thereon was further laminated on the exposed internal electrode side to prepare a laminated body. The laminated body was fired at 1170° C. Next, an Ag electrode was formed on the laminated body on the external side thereof to manufacture a laminate type piezoelectric/electrostrictive actuator (piezoelectric/electrostrictive element). Incidentally, an electron micrograph of the piezoelectric/electrostrictive body constituting the piezoelectric/electrostrictive element of Example 1 is shown in FIG. 4A.

Examples 2 to 10, Comparative Examples 1 to 7

Figure 5A:
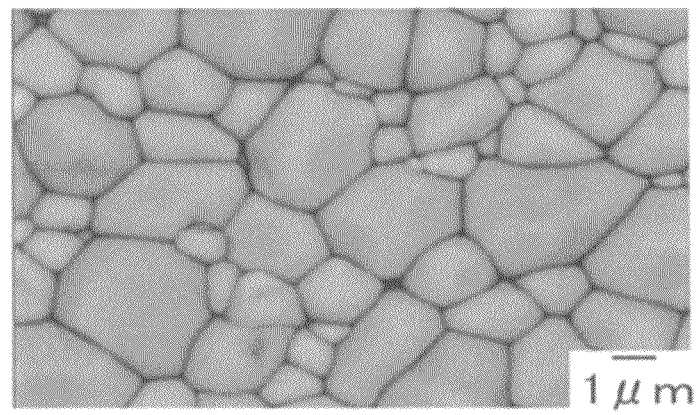
FIG. 5A is an electron micrograph showing a piezoelectric/electrostrictive body constituting the piezoelectric/electrostrictive element of Comparative Example 5.

Each of the laminate type piezoelectric/electrostrictive actuators (piezoelectric/electrostrictive elements) was manufactured in the same manner as in Example 1 except that the used amounts of the raw materials were changed to obtain the parameters in the composition formula as shown in Table 1. Incidentally, an electron micrograph of the piezoelectric/electrostrictive body constituting the piezoelectric/electrostrictive element of Comparative Example 5 is shown in FIG. 5A.

In Table 1, each of the parameters corresponds to a parameter in the following composition formula:

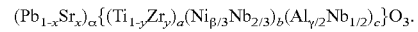

$(Pb_{1-x}Sr_x)_\alpha\{(Ti_{1-y}Zr_y)_a(Ni_{\beta/3}Nb_{2/3})_b(Al_{\gamma/2}Nb_{1/2})_c\}O_3$.

TABLE 1

| | Parameter in composition formula of piezoelectric/electrostrictive ceramic composition | | | | | | | |
|---|---|---|---|---|---|---|---|---|
| | x | y | a | b | c | α | β | γ |
| Upper limit | 0.030 | 0.540 | 0.910 | 0.360 | 0.080 | 1.030 | 1.030 | 1.030 |
| Lower limit | 0.005 | 0.450 | 0.580 | 0.070 | 0.020 | 0.970 | 0.970 | 0.970 |
| Example 1 | 0.020 | 0.488 | 0.850 | 0.070 | 0.080 | 1.000 | 1.000 | 1.000 |
| Example 2 | 0.010 | 0.488 | 0.860 | 0.100 | 0.040 | 1.000 | 1.000 | 1.000 |
| Example 3 | 0.005 | 0.488 | 0.820 | 0.160 | 0.020 | 1.000 | 1.000 | 1.000 |
| Example 4 | 0.005 | 0.488 | 0.580 | 0.360 | 0.060 | 1.000 | 1.000 | 1.000 |
| Comparative Example 1 | 0.010 | 0.440 | 0.860 | 0.100 | 0.040 | 1.000 | 1.000 | 1.000 |
| Comparative Example 2 | 0.010 | 0.550 | 0.860 | 0.100 | 0.040 | 1.000 | 1.000 | 1.000 |
| Comparative Example 3 | 0.010 | 0.488 | 0.910 | 0.050 | 0.040 | 1.000 | 1.000 | 1.000 |
| Comparative Example 4 | 0.010 | 0.488 | 0.810 | 0.100 | 0.090 | 1.000 | 1.000 | 1.000 |
| Comparative Example 5 | 0.010 | 0.488 | 0.860 | 0.140 | 0.000 | 1.000 | 1.000 | 1.000 |
| Example 5 | 0.010 | 0.488 | 0.860 | 0.100 | 0.040 | 0.970 | 1.000 | 1.000 |
| Example 6 | 0.010 | 0.488 | 0.860 | 0.100 | 0.040 | 1.030 | 1.000 | 1.000 |
| Example 7 | 0.010 | 0.488 | 0.860 | 0.100 | 0.040 | 1.000 | 0.970 | 1.000 |
| Example 8 | 0.010 | 0.488 | 0.860 | 0.100 | 0.040 | 1.000 | 1.030 | 1.000 |
| Example 9 | 0.010 | 0.488 | 0.860 | 0.100 | 0.040 | 1.000 | 1.000 | 0.970 |
| Example 10 | 0.010 | 0.488 | 0.860 | 0.100 | 0.040 | 1.000 | 1.000 | 1.030 |
| Comparative Example 6 | 0.000 | 0.488 | 0.860 | 0.100 | 0.040 | 1.000 | 1.000 | 1.000 |

TABLE 2

| | Piezoelectric/electrostrictive body | Piezoelectric/electrostrictive element | | | |
|---|---|---|---|---|---|
| | Average grain diameter (μm) | Displacement (nm) | Evaluation | Insulation resistance (Ω) | Evaluation |
| Example 1 | 1.1 | 236 | Excellent | $1.4 \times 10^{10}$ | Excellent |
| Example 2 | 1.4 | 256 | Excellent | $2.2 \times 10^{10}$ | Excellent |
| Example 3 | 1.8 | 244 | Excellent | $8.8 \times 10^9$ | Good |
| Example 4 | 1.6 | 201 | Good | $1.3 \times 10^{10}$ | Excellent |
| Comparative Example 1 | 1.5 | 189 | Poor | $1.5 \times 10^{10}$ | Excellent |
| Comparative Example 2 | 1.5 | 159 | Poor | $1.1 \times 10^{10}$ | Excellent |
| Comparative Example 3 | 1.2 | 240 | Excellent | $4.8 \times 10^7$ | Poor |

TABLE 2-continued

| | Piezoelectric/electrostrictive body | Piezoelectric/electrostrictive element | | | |
|---|---|---|---|---|---|
| | Average grain diameter (μm) | Displacement (nm) | Evaluation | Insulation resistance (Ω) | Evaluation |
| Comparative Example 4 | 0.8 | 195 | Poor | $1.1 \times 10^{10}$ | Excellent |
| Comparative Example 5 | 5.3 | 214 | Good | $6.4 \times 10^{6}$ | Poor |
| Example 5 | 1.9 | 222 | Good | $4.4 \times 10^{9}$ | Good |
| Example 6 | 1.3 | 211 | Good | $9.6 \times 10^{9}$ | Excellent |
| Example 7 | 1.8 | 208 | Good | $8.5 \times 10^{9}$ | Good |
| Example 8 | 1.3 | 229 | Good | $1.4 \times 10^{10}$ | Excellent |
| Example 9 | 1.9 | 218 | Good | $5.5 \times 10^{8}$ | Good |
| Example 10 | 1.6 | 206 | Good | $1.7 \times 10^{10}$ | Excellent |
| Comparative Example 6 | 4.5 | 235 | Excellent | $1.7 \times 10^{7}$ | Poor |

As understood from the results shown in Table 2, each piezoelectric/electrostrictive body made of a piezoelectric/electrostrictive ceramic composition represented by the predetermined composition formula had grains of a small average grain diameter, and the piezoelectric/electrostrictive element maintained a desired displacement comparable with a conventional element and was excellent in insulation resistance under a high-humidity environment (see Examples 1 to 10). In particular, in the case that the average grain diameter of the grains was 1.7 μm or less, the insulation resistance was particularly excellent (see Examples 1, 2, 4, 6, 8, and 10).

On the other hand, in the case of a piezoelectric/electrostrictive body made of a piezoelectric/electrostrictive ceramic composition which was not represented by the predetermined composition formula, while the grains had a small average grain diameter, the displacement of the piezoelectric/electrostrictive element was greatly inferior, or the insulation resistance was poor (see Comparative Examples 1 to 4). In addition, the piezoelectric/electrostrictive body made of a conventional piezoelectric/electrostrictive ceramic composition had grains of a large average grain diameter, and the piezoelectric/electrostrictive element had low insulation resistance under a high-humidity environment (see Comparative Example 5). Further, the piezoelectric/electrostrictive body made of a piezoelectric/electrostrictive ceramic composition where a part of the Pb ion was not substituted with the Sr ion in the A site ion had grains of a large average grain diameter, and the piezoelectric/electrostrictive element had low insulation resistance under a high-humidity environment (see Comparative Example 6).

Example 11

A laminate type piezoelectric/electrostrictive actuator (piezoelectric/electrostrictive element) was manufactured in the same manner as in Example 1 except that the firing temperature was 1100° C. Incidentally, an electron micrograph of the piezoelectric/electrostrictive body constituting the piezoelectric/electrostrictive element of Example 11 is shown in FIG. 4B.

Comparative Example 8

Figure 5B:
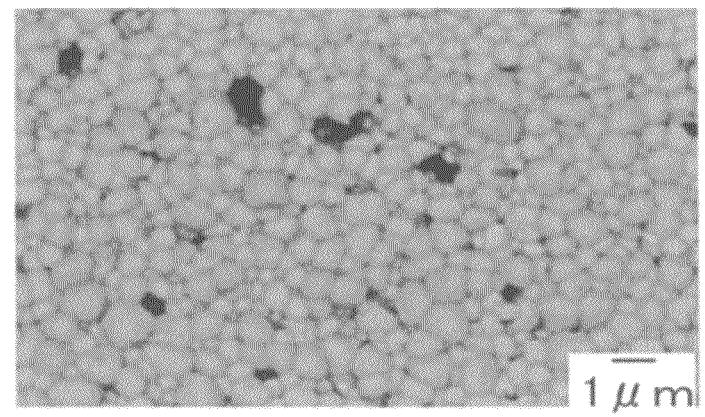
FIG. 5B is an electron micrograph showing a piezoelectric/electrostrictive body constituting the piezoelectric/electrostrictive element of Comparative Example 8.

A laminate type piezoelectric/electrostrictive actuator (piezoelectric/electrostrictive element) was manufactured in the same manner as in Comparative Example 5 except that the firing temperature was 1100° C. Incidentally, an electron micrograph of the piezoelectric/electrostrictive body constituting the piezoelectric/electrostrictive element of Comparative Example 8 is shown in FIG. 5B.

Figure 4B:
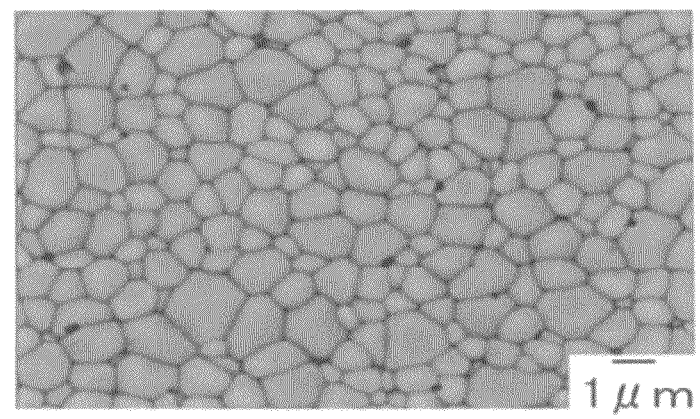
FIG. 4B is an electron micrograph showing a piezoelectric/electrostrictive body constituting the piezoelectric/electrostrictive element of Example 11.

As understood from FIGS. 4A and 4B, the average grain diameter of the grains constituting the piezoelectric/electrostrictive bodies made of a piezoelectric/electrostrictive ceramic composition represented by the predetermined composition are almost the same regardless of a temperature condition. On the other hand, it is understood that the average grain diameter of the grains constituting a piezoelectric/electrostrictive body made of a conventional piezoelectric/electrostrictive ceramic composition significantly depends on a temperature condition as understood from FIGS. 5A and 5B.

Since a piezoelectric/electrostrictive element of the present invention has a desired displacement comparable with a conventional element and has less of a decline in the insulation resistance even when it is used under a high-humidity environment, it can be used for a highly reliable products that are required in recent years.

What is claimed is:

1. A piezoelectric/electrostrictive element comprising a piezoelectric/electrostrictive body made of a piezoelectric/electrostrictive ceramic composition containing $Pb(Ni_{1/3}Nb_{2/3})O_3$—$PbTiO_3$—$PbZrO_3$ ternary solid solution system composition as a main component, and an electrode disposed on the piezoelectric/electrostrictive body, wherein the ternary solid solution system composition is represented by the following composition formula:

(where $0.005 \leq x \leq 0.03$, $0.45 \leq y \leq 0.54$, $0.58 \leq a \leq 0.91$, $0.07 \leq b \leq 0.36$, $0.02 \leq c \leq 0.08$, $0.97 \leq \alpha \leq 1.03$, $0.97 \leq \beta \leq 1.03$, $0.97 \leq \gamma \leq 1.03$, and $(a+b+c=1.000)$).

2. A piezoelectric/electrostrictive element according to claim 1, which comprises a plurality of piezoelectric/electrostrictive bodies and a plurality of electrodes, wherein the plurality of piezoelectric/electrostrictive bodies are alternately laminated with the plurality of electrodes to have a laminate structure.

3. A piezoelectric/electrostrictive element according to claim 1, wherein an average grain diameter of grains constituting the piezoelectric/electrostrictive body is 0.5 to 2 μm.

4. A piezoelectric/electrostrictive element according to claim 2, wherein an average grain diameter of grains constituting the piezoelectric/electrostrictive body is 0.5 to 2 μm.

* * * * *